(12) United States Patent
Steiner et al.

(10) Patent No.: US 7,332,775 B2
(45) Date of Patent: Feb. 19, 2008

(54) PROTRUDING SPACERS FOR SELF-ALIGNED CONTACTS

(75) Inventors: Kurt George Steiner, Fogelsville, PA (US); Gerald W. Gibson, Jr., Orlando, FL (US); Eduardo Jose Quinones, Celebration, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/542,864

(22) Filed: Oct. 4, 2006

(65) Prior Publication Data
US 2007/0023848 A1   Feb. 1, 2007

Related U.S. Application Data

(63) Continuation of application No. 10/234,354, filed on Sep. 3, 2002, now Pat. No. 7,126,198.

(51) Int. Cl.
H01L 31/119 (2006.01)
H01L 21/336 (2006.01)

(52) U.S. Cl. ............. 257/346; 257/387; 257/412; 257/E21.624; 257/E21.638; 438/299; 438/412

(58) Field of Classification Search ......... 257/412, 257/750, 751, 754, E21.624, E21.638, E21.476, 257/346, 387; 438/592, 595, 652, 655, 299
See application file for complete search history.

(56) References Cited

U.S. PATENT DOCUMENTS

| 5,089,434 A | 2/1992 | Hollinger ............ 437/41 |
| 6,096,642 A | 8/2000 | Wu ................... 438/655 |
| 6,114,209 A | 9/2000 | Chu et al. ........... 438/300 |
| 6,121,096 A | 9/2000 | Hopper .............. 438/290 |
| 2002/0079548 A1 | 6/2002 | Hu .................. 257/412 |
| 2002/0102430 A1 | 8/2002 | Shirahata ........... 428/629 |

Primary Examiner—Hsien-Ming Lee
(74) Attorney, Agent, or Firm—Steve Mendelsohn

(57) ABSTRACT

A protruding spacer that protrudes above the top surface of a gate electrode structure provides enhanced resistance to exposure of the gate electrode during the etch process used to form self-aligned contacts. The protruding spacer may be formed using an amorphous carbon sacrificial layer as the top layer of the patterned gate electrode structure. Dielectric spacers are formed alongside the gate electrode structure, including alongside the sacrificial amorphous carbon layer. The dielectric spacers extend substantially to the top of the amorphous carbon layer. The amorphous carbon layer is then removed such that the remaining gate structure includes dielectric spacers that have a protruding section that protrudes above the top surface of the remaining gate structure. A nitride layer may be formed over the gate structure. Such a structure prevents exposure of the gate electrode during the formation of self-aligned contacts, and shorting, once the contact openings are filled.

20 Claims, 4 Drawing Sheets

US 7,332,775 B2

PROTRUDING SPACERS FOR SELF-ALIGNED CONTACTS

RELATED APPLICATIONS

This application is a continuation of U.S. patent application Ser. No. 10/234,354 (Gibson 10-1-28), filed Sep. 3, 2002, now U.S. Pat. No. 7,126,198, the contents of which are incorporated herein by reference in their entirety.

FIELD OF THE INVENTION

The present invention relates, most generally, to semiconductor products and methods for forming the same. More particularly, the present invention relates to a method and structure for forming protruding spacers to enable the formation of self-aligned contacts.

BACKGROUND OF THE INVENTION

In today's rapidly advancing semiconductor manufacturing industry, there is a constant drive to reduce chip size and increase chip functionality. Stated alternatively, there is a drive to increase integration levels and reduce feature sizes of the devices that combine to form an integrated circuit chip. Using conventional processing techniques, contacts are formed by forming an opening through an insulating layer or layers, and exposing and contacting the top surface of a polysilicon or other interconnect lead which may be connected, for example, to a source/drain region formed in the substrate. Self-aligned contacts (SACs) now afford an increased level of integration by providing contact directly through an insulating layer or layers such as interlevel dielectric layers to directly contact the substrate region such as the source/drain region. In each case the contact openings are subsequently filled with a conductive or a semiconductor material.

As design rules allow for tighter and tighter geometries, and more closely spaced device components, it is a challenge to produce SACs that provide contact to source/drain regions while in close proximity to the associated gate structure. A gate structure typically includes a gate dielectric, a gate electrode, and other materials which form a stack aligned over a transistor channel that extends laterally from the source/drain regions formed on opposed sides of the gate structure. Gate structures commonly use dielectric spacers formed alongside the sidewalls of the gate structures. The sidewall spacers are typically formed of an oxide material, and it is common to form a nitride (silicon nitride, $Si_3N_4$) film over the gate structure including over the sidewall spacers. This is done because, when an etching operation is used to form an opening for an SAC that extends through interlevel dielectrics and exposes a source/drain region in close proximity to the gate structure, the nitride film prevents the sidewall spacer from being attacked because the nitride film is formed of a different material and is resistant to the etch chemistries and conditions used to etch the interlevel dielectrics and that may otherwise attack the oxide spaces. If the sidewall spacer is attacked and removed in part, and the sidewall of the gate electrode exposed, then the source/drain region and the gate structure itself will become shorted once the opening is filled with a conductive material, rendering the transistor inoperable. The nitride film is used to prevent such shorting from occurring. The etch selectivity between the interlevel dielectric desired to be etched and the nitride film which is desired to inhibit etching, is generally good. Therefore typical self-aligned contact processes exploit the etch selectivity between the interlevel dielectric and the nitride or other liner materials.

SAC processes using these conventional materials are becoming less manufacturable, however, as design rules allow for tighter geometries where high density plasma (HDP) dielectrics are required for use as pre-metal dielectrics. While HDP dielectrics are able to fill more aggressive aspect ratio gaps, their etch selectivity with respect to silicon nitride liner materials is generally poor. Moreover, aggressive design rules now provide for such SAC openings to be formed in closer proximity to the gate structure, and contacting the source/drain region. Therefore, the process is very alignment-sensitive, and a slight misalignment of the SAC opening may result in a contact opening exposing the nitride liner that extends along the oxide spacer adjacent the sidewall of the gate structure. This renders the gate structure more susceptible to attack during the etch process used to etch SAC openings in the HDP dielectric. Furthermore, conventional spacers extend to and terminate at the top surface of the gate structure. The nitride liner is most susceptible to erosion at the elbow point on top of the spacer due to general etch physics and the fact that the nitride liner may be thinnest at the point directly above the top of the spacer. If the nitride layer is eroded at this point, the underlying spacer which tapers to a point at this elbow point, may be attacked and a part of the gate electrode of the gate structure may be exposed. If so, the source/drain region will be shorted to the gate electrode when the contact structure is filled with a conductor.

One approach to addressing this problem is to improve the etch selectivity between the new HDP interlevel dielectrics and the nitride layer by using interlevel dielectric layers with increased dopant levels and/or using lower density fill materials such as ozone reacted oxides. The shortcoming of this approach, however, is that the higher dopant concentration materials have difficulty filling high aspect ratio structures. There is indeed a tradeoff between a high etch selectivity which inhibits attack of the nitride layer and therefore prevents shorting, and a dielectric material that is capable of filling high aspect ratio openings. Another shortcoming associated with highly doped dielectric layers such as boron or phosphorus doped silicon oxides is the associated thermal budget constraints as many advanced devices must be maintained at temperatures below 600 or 700° C.

There is thus a demonstrated need to produce a method and structure that enables self-aligned contact to source/drain regions that are in close proximity to the gate structure and which is resistant to shorting between the gate structure and the source/drain region being contacted.

SUMMARY OF THE INVENTION

The present addresses these and other needs and provides, in one aspect, a method for forming a semiconductor product. An exemplary method includes forming a gate structure over a surface, the gate structure having a set of opposed sidewalls and including an uppermost sacrificial layer disposed over a subjacent surface. Each of the sacrificial layer and the subjacent surface terminate laterally at the opposed sidewalls. Oxide spacers are then formed along the sidewalls. The sacrificial layer is then removed such that each of the sidewalls includes a protruding section that protrudes above the subjacent surface, and thereby, the gate structure.

The present invention also provides a semiconductor product comprising a gate structure formed over semiconductor substrate. The gate structure has a pair of opposed sidewalls and a height. A pair of dielectric spacers are included, each spacer extending along a respective sidewall.

The spacers each include a spacer height greater than the height of the gate structure such that the spacers include portions that extend above the gate structure.

BRIEF DESCRIPTION OF THE DRAWING

The present invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Like numerals denote like features throughout the specification and drawing. Included in the drawing are the following figures:

FIG. 1 shows a stack of films formed over a substrate;

FIG. 2 shows the structure shown in FIG. 1 after an etch operation has been used to define and form part of the gate structure of the present invention;

FIG. 3 shows the structure in FIG. 2 after additional layers have been removed to form the gate structure;

FIG. 4 shows the structure in FIG. 3 after sidewall spacers and source/drain regions have been formed;

FIG. 5 shows the structure in FIG. 4 after the sacrificial layer has been removed to form the protruding spacer portions;

FIG. 6 shows the structure in FIG. 5 after a nitride liner has been formed over the structure; and FIG. 7 shows two gate structures such as shown in FIG. 6 formed on a substrate and a proposed self-aligned contact (SAC) opening located between the gate structures.

Like numerals denote like features throughout the specification and drawings.

DETAILED DESCRIPTION OF THE INVENTION

In the following examples, the present invention provides a gate structure having an upper layer formed of a sacrificial material and oxide spacers formed along sidewalls of the gate structure including along the sacrificial layer. After the oxide spacers are formed, the sacrificial upper layer is removed so that each oxide spacer extends above the top surface of the gate structure that remains after the sacrificial layer is removed. A silicon nitride layer or the like may be formed over the gate structure including over the protruding spacers. This layer may be described as a liner. When self-aligned contacts are then formed to contact the source/drain regions of the gate structure, for example, a more robust process is achieved because the protruding spacers, in conjunction with the nitride liner, prevent attack of the spacers and exposure of the gate structure sidewalls, even when the contact structures are misaligned.

Figure 1:
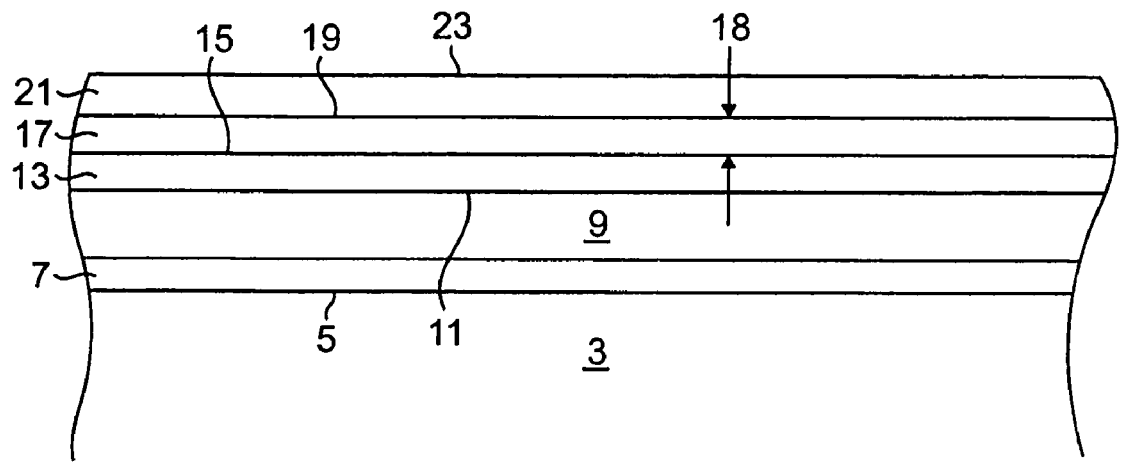
FIGS. 1-7 are each cross-sectional views and illustrate a sequence of processing operations used to form the protruding spacers of the present invention.

FIG. 1 is a cross-sectional view showing a series of films formed over a substrate. The series of films will be used to form a gate structure such as the gate of a MOSFET, metal oxide semiconductor field effect transistor. Substrate 3 may be a semiconductor substrate such as silicon which may be doped or undoped, gallium arsenide, or other suitable semiconductor substrate materials. Gate dielectric 7 is formed over surface 5 of substrate 3. Various suitable gate dielectrics, such as a gate oxide, or a combination of an oxide/nitride or oxide/oxynitride/nitride may be used. Various thicknesses of gate dielectric 7 may be used depending on the device operational parameters and the physical characteristics of the other layers that form the transistor. Gate electrode layer 9 may be any of various and suitable semiconductor and/or conductive materials used to form transistor gates. In one exemplary embodiment, gate electrode layer 9 may be polysilicon. In another exemplary embodiment, gate electrode layer 9 may be a composite layer of a cobalt silicide layer over a layer of polysilicon. In yet another exemplary embodiment, gate electrode layer 9 may be a composite layer of tungsten silicide over a layer of polysilicon. In one particular embodiment, the overlying silicide layer may include a thickness of 800 angstroms and the polysilicon may include a thickness of 1000 angstroms. Such is intended to be exemplary only, and various other doped or undoped monolayers or composite layers may be used and may include various thicknesses to form gate electrode layer 9. Gate electrode layer 9 includes top surface 11. Hardmask layer 13 is formed over top surface 11 of gate electrode layer 9. Hardmask layer 13 may be an oxide in one exemplary embodiment, but other suitable hardmask materials may be used in other exemplary embodiments. Hardmask layer 13 includes upper surface 15. Various conventional and suitable processes of formation may be used to produce each of the aforementioned films.

Sacrificial layer 17 is formed over hardmask layer 13. In an exemplary embodiment, sacrificial layer 17 may be amorphous carbon. Amorphous carbon is a hydrogenated carbon and it may be formed to a thickness ranging from 1000 to 2500 angstroms. In one exemplary embodiment, the amorphous carbon sacrificial layer 17 may additionally be doped with nitrogen. In one exemplary embodiment, sacrificial layer 17 includes a thickness 18 of 1800 angstroms. Sacrificial layer 17 may be formed using a low power PECVD (Plasma Enhanced Chemical Vapor Deposition) process. According to the exemplary embodiment in which sacrificial layer 17 is amorphous carbon, a PECVD process including 175 sccm propylene, $C_3H_6$, 2000 sccm nitrogen, 6.5 torr pressure, a power of 1100 watts RF and a temperature of 450° C. may be used to form the amorphous carbon. Such is intended to be exemplary only and various other process flows, pressures, powers and temperatures may be used to form an amorphous carbon film. Butane, methane, or other species may be used in place of propylene as the carbon source. Sacrificial layer 17 may also be formed of other materials and using other methods. Sacrificial layer 17 includes upper surface 19. Dielectric anti-reflective coating layer 21 is formed over upper surface 19 of sacrificial layer 17. Various suitable materials may be used as the dielectric anti-reflective coating such as DARC™ by Applied Materials, Inc., PEARL by Novellus Systems, Incand other hydrogenated silicon oxynitride materials. Dielectric anti-reflective coating layer 21 includes top surface 23. According to another exemplary embodiment, other anti-reflective coatings may be used, and according to still another exemplary embodiment, an anti-reflective layer may not be needed.

Figure 2:
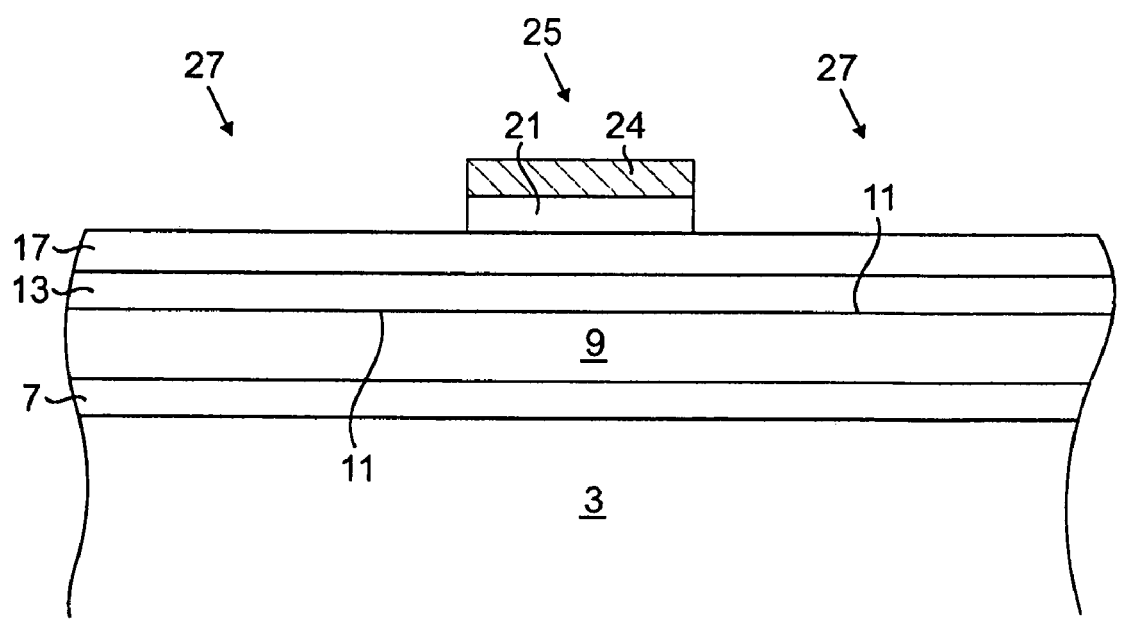

Now turning to FIG. 2, a partially formed gate structure is shown. A photosensitive layer such as a photoresist is formed over top surface 23 of dielectric anti-reflective coating layer 21. Conventional photolithographic techniques may be used to pattern the photosensitive film and produce masking film 24 in gate region 25. A series of etching operations are then used to remove portions of dielectric anti-reflective coating layer 21, sacrificial layer 17 and hardmask layer 13 from other regions 27 leaving portions of the aforementioned films in gate region 25 to form a gate structure. According to one exemplary process sequence, a $CF_4/Ar$ etch may be used to etch the dielectric anti-reflective coating layer 21 as illustrated in FIG. 2. Other Freon-based etch chemistries may be used in other exemplary embodiments. In still other exemplary embodiments, other fluorine-containing etchant gases such as $NF_3$ or $SF_6$ may be used.

Figure 3:
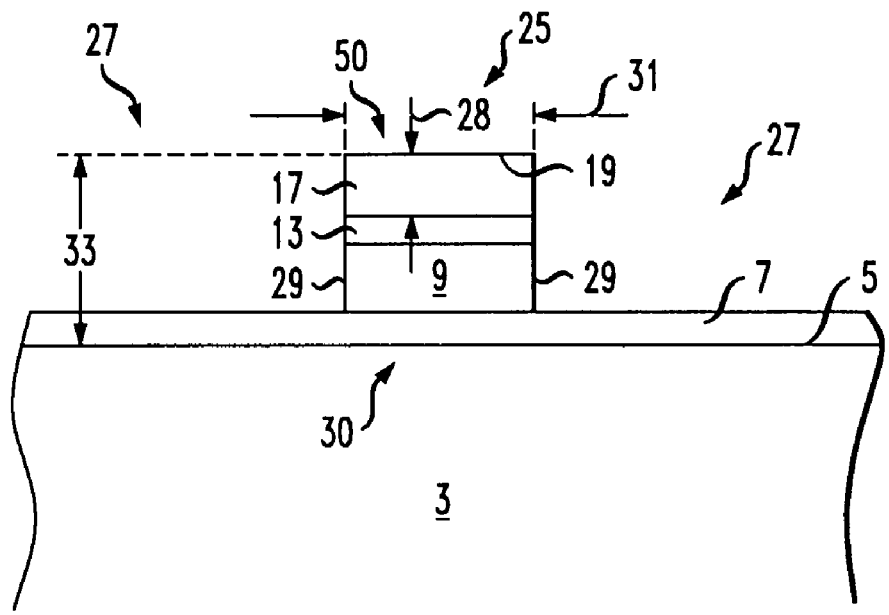

This may be followed by an $O_2$ etching process that strips masking film 24 while etching sacrificial layer 17 to remove the same from other regions 27. Various suitable etching processes may then be used to etch portions of hardmask layer 13 from other regions 27, as shown in FIG. 3. In one embodiment, a Freon-based etch chemistry such as $CF_4/Ar$, may be employed. In other exemplary embodiments, other fluorine-containing etch gases such as $NF_3$ or $SF_6$ may be used. This procedure used to remove hardmask layer 13 from other regions 27, may also partially or completely strip dielectric anti-reflective coating layer 21 within gate region 25 thereby exposing sacrificial layer 17 in gate region 25.

As shown in FIG. 3, various conventional and suitable processes may be used to remove gate electrode layer 9 from other regions 27 and the etch process or processes used will depend on the materials used to form gate electrode layer 9. In one exemplary embodiment, an $HBr/Cl_2/CF_4$ gate etch may be used, but other suitable etch chemistries may also be used in other embodiments. In one exemplary embodiment in which the gate dielectric is an oxide, the gate etch may be endpointed on gate dielectric 7 by adding $O_2$ to the etch chemistry. Such addition of $O_2$ may remove a portion of sacrificial layer 17 from gate structure 50 if sacrificial layer 17 has already been exposed. Gate dielectric 7 may optionally be removed at this point using a dedicated etching process with suitable selectivity. After these etch processes have taken place, any of various stripping processes such as an $O_2$ strip, may be used to remove any residual dielectric anti-reflective coating layer 21 from over the gate structure. Such a stripping process may further reduce the thickness of sacrificial layer 17, in addition to the $O_2$ based etch used to endpoint the gate electrode etch on the gate dielectric. In an exemplary embodiment in which original thickness 18 (shown in FIG. 1) of sacrificial layer 17 was 1800 angstroms, thickness 28 may be on the order of 1200-1700 angstroms, and in one particular embodiment may be 1500 angstroms. In other exemplary embodiments, thickness 28 may range from 500-2000 angstroms. Gate structure 50 now includes a top surface that is upper surface 19 of sacrificial layer 17, a height 33 and a width 31, which may be as low as 140 nanometers. Other dimensions may be used in other exemplary embodiments. Gate structure 50 also includes substantially vertical opposed sidewalls 29. Opposed sidewalls 29, and therefore gate structure 50, include height 33.

Figure 4:
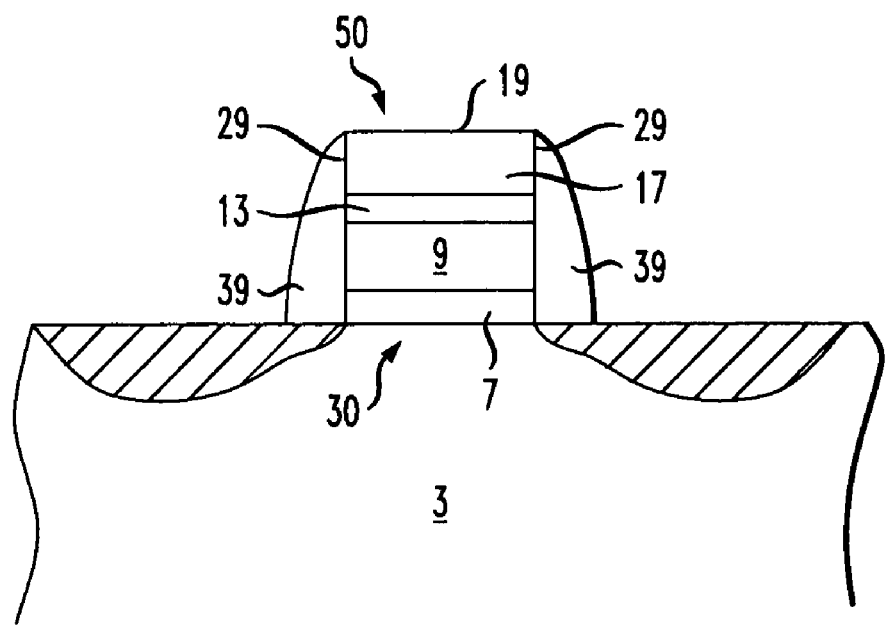

Now turning to FIG. 4, the gate structure 50 is shown after the conventional formation of source/drain regions 35. A thin dielectric spacer film is formed over the structure shown in FIG. 3, then etched to form opposed spacers 39. In an exemplary embodiment, the thin dielectric spacer film may be formed to a thickness of 1000 angstroms, but other film thicknesses may be used in other exemplary embodiments. In one exemplary embodiment, the thin dielectric spacer film may be an oxide film and various suitable oxide deposition techniques may be used to form the film.

In other exemplary embodiments, the thin dielectric spacer film and the spacers formed therefrom, may be formed of materials other than undoped oxides. The thin dielectric film is chosen to have differential etch characteristics with respect to the sacrificial layer 17. In the exemplary embodiment in which sacrificial layer 17 is amorphous carbon, the thin dielectric spacer film may be a doped oxide, a nitride, an oxynitride, or a silicon carbide, for example.

The differential etch characteristics between the thin dielectric spacer film and the sacrificial layer enable the formation of spacers without the attack of the sacrificial layer and also enable the subsequent removal of the sacrificial layer without attacking the spacers. This enables the formation of protruding spacers as will be shown in FIG. 5. For brevity, however, the following description will cover the exemplary embodiment in which the sacrificial layer 17 is amorphous carbon and the spacers are formed of an oxide. Such is intended to be exemplary only.

The relatively high thermal budget of the amorphous carbon sacrificial layer allows the thin oxide spacer film to be formed over it. Spacers 39 are then formed from the thin dielectric spacer film using conventional etching techniques. An exceptional amorphous carbon-to-oxide etch selectivity allows the spacer edge to recede and oxide spacers 39 to be formed without substantially attacking the amorphous carbon sacrificial layer 17. During the spacer formation process, gate dielectric 7 is also removed from other regions 27 to expose surface 5 if not removed prior to the deposition of the thin oxide spacer film. Within gate region 25, sacrificial layer 17 is exposed but left substantially intact during the spacer-formation etching process, resulting in sections of oxide spacer 39 formed alongside sacrificial layer 17. Oxide spacers 39 form a conterminous boundary with opposed sidewalls 29 and extend substantially up to upper surface 19 of sacrificial layer 17 and above the subjacent upper surface 15 of hardmask 13. As such, sidewall spacers 39 include substantially the same height as gate structure 50. Due to their relatively distinct etching characteristics, the thin oxide layer and the amorphous carbon can be removed independently Source/drain regions 35 are self-aligned structures and may now be formed using various suitable and conventional means for introducing dopant impurities into surface 5 of substrate 3. The source/drain implant goes through the spacer and is therefore more shallow in the substrate regions below spacer 39, and immediately adjacent gate structure 50. The presence of sacrificial layer 17 assists in preventing the source/drain implant from reaching gate electrode 9. Channel 30 now extends between source/drain regions 35 and beneath gate structure 50. According to another exemplary process sequence, source/drain regions 35 may be formed within the structure as illustrated in FIG. 3 and therefore prior to spacer formation.

Figure 5:
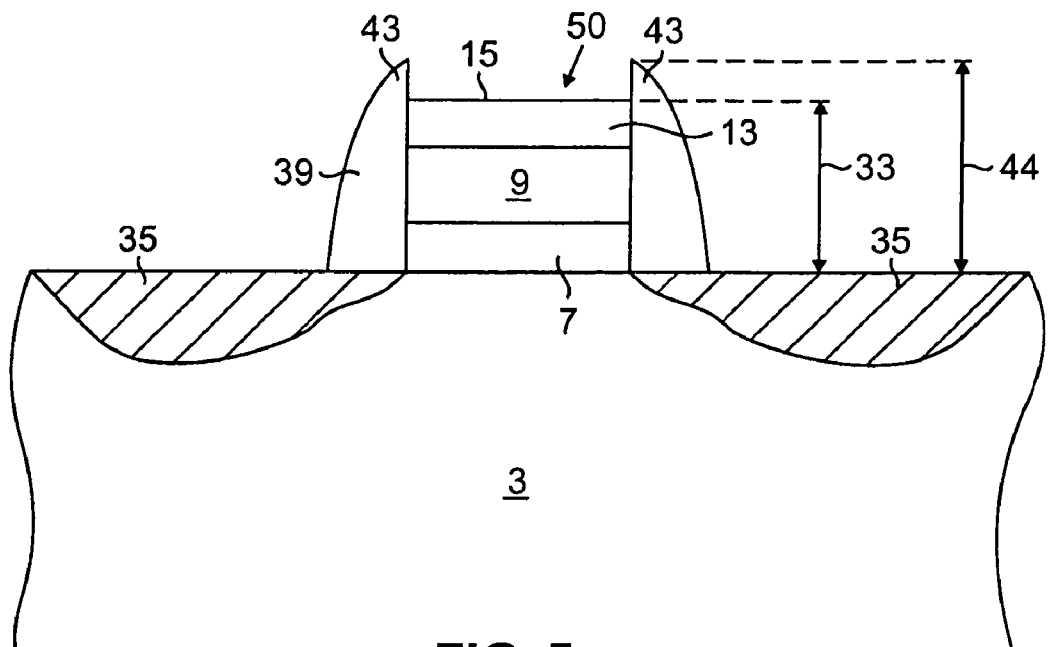

Sacrificial layer 17 is then removed. FIG. 5 shows the structure of FIG. 4, after sacrificial layer 17 has been removed. According to the exemplary embodiment in which sacrificial layer 17 is formed of amorphous carbon, an 02 etch may be used to selectively remove the amorphous carbon sacrificial layer while maintaining hardmask layer 13 and sidewall spacers 39 intact. According to other exemplary embodiments, other etch processes may be used to remove the amorphous carbon sacrificial layer. After the removal of amorphous carbon sacrificial layer 17, protruding sections 43 protrude above the gate structure, i.e., above upper surface 15 of hardmask 13 which is exposed once sacrificial layer 17 is removed.

According to still other exemplary embodiments in which the sacrificial layer is formed of other materials, various suitable selective etching processes may be used to remove the sacrificial layer while substantially retaining hardmask layer 13 and oxide spacers 39. After this etching procedure is carried out, oxide spacers 39 each include a protruding section 43, which extends above upper surface 15 of hardmask layer 13. As such, each of oxide spacers 39 includes a spacer height 44 greater than height 33 of gate structure 50.

Protruding sections 43 extend above the existing gate structure 50 by a distance equal approximately to former thickness 28 of now-removed sacrificial layer 17, at the point in time when oxide spacers 39 were formed.

Figure 6:
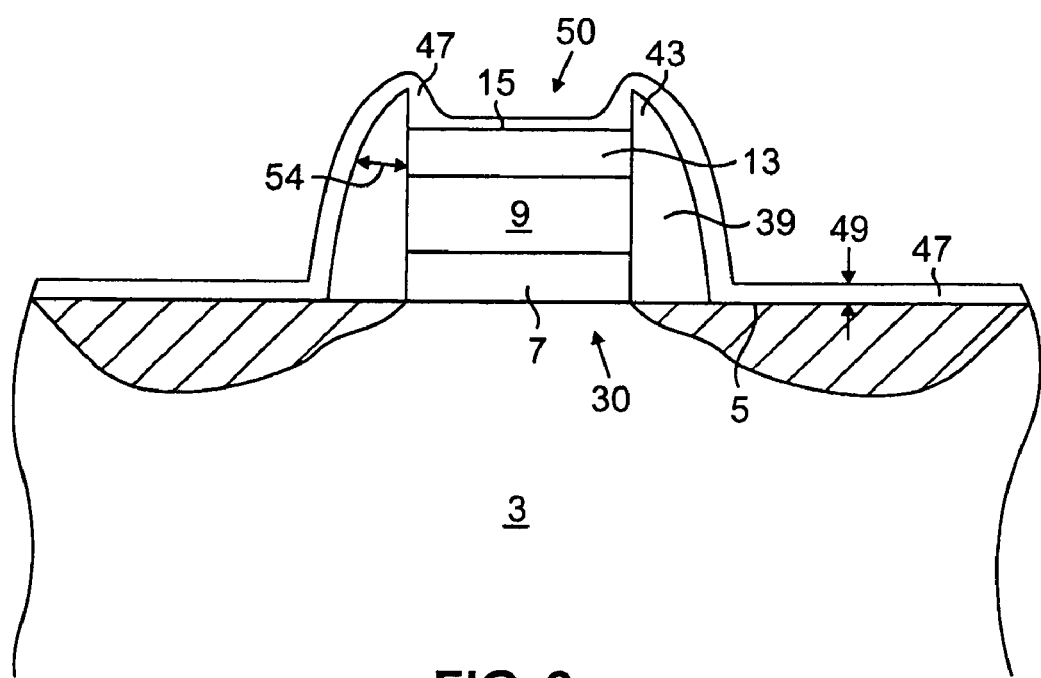

FIG. 6 shows nitride layer 47 formed over the structure shown in FIG. 5. Nitride layer 47 includes thickness 49, which may range from 200-2000 angstroms according to various exemplary embodiments. According to one exemplary embodiment, nitride layer 47, alternatively referred to as nitride liner 47, may include thickness 49 of 500 angstroms. Such is intended to be exemplary only, and various other thicknesses may be used in other exemplary embodiments. Nitride layer 47 is formed over surface 5 of substrate 3 and over gate structure 50. In particular, nitride layer 47 is formed over surface 15 of hardmask 13, over protruding sections 43 of oxide spacers 39 and over substrate 3. Various suitable and conventional methods may be used to form nitride layer 47. In other exemplary embodiments, other suitable liners may be used instead of nitride layer 47. Such liners are preferably formed of materials that are resistant to the etching chemistries used to form the SAC openings.

FIG. 6 also illustrates approach distance 54, which is the closest distance from a portion of gate electrode layer 9 to the outside of spacer 39. Approach distance 54 may vary in various exemplary embodiments and may range between 200-500 angstroms in one exemplary embodiment. In a sense, approach distance 54 represents one measurement of the margin of error during an etch process used to form a self-aligned contact in a region near gate structure 50. Approach distance 54 may represent the thinnest amount of material that must be removed to expose gate electric layer 9 and thereby provide a short when a conductive or semiconductor material is used to fill the contact opening formed during the etching process, that exposes gate electrode layer 9. An advantageous aspect of the present invention is that approach distance 54 is increased in comparison to conventional arrangements in which the spacers taper to a point and terminate vertically at the top of the gate structure. In this manner, the protective nitride layer 47 is disposed further from the gate electrode material to provide a wider process margin and thereby decreasing the possibility that erosion of the nitride layer will result in exposure of the gate electrode layer 9.

Figure 7:
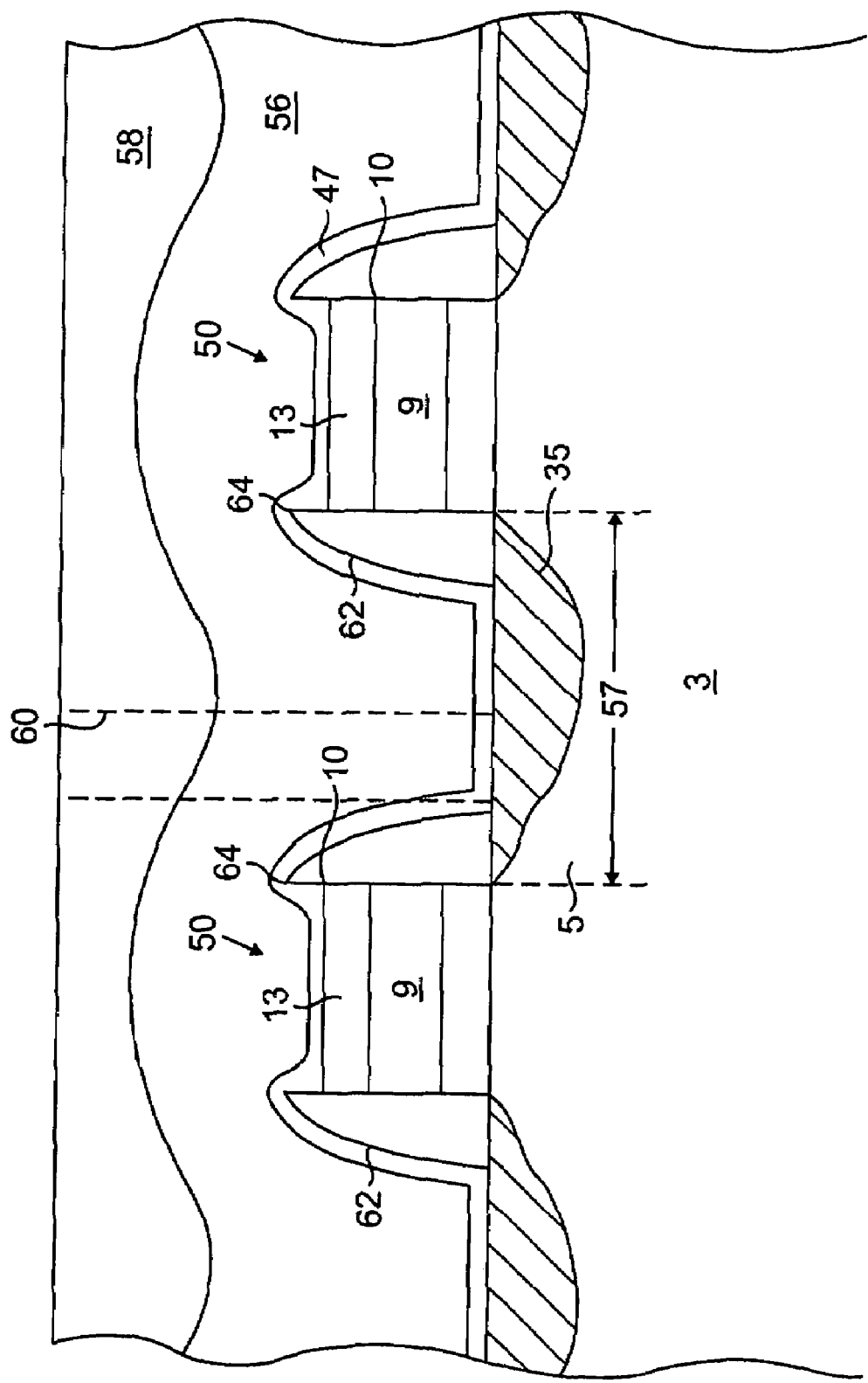

FIG. 7 is another cross-sectional view showing two gate structures 50 formed in close proximity to one another. According to one exemplary embodiment, distance 57 between gate structures 50 may be on the order of 140 nanometers, which may be consistent with the design rules in which width 31 of gate structure 50 (see FIG. 3) is also on the same order. Other widths 57 may be used in other exemplary embodiments. Pre-metal dielectrics 56 and 58 are disposed over the gate structures and may be formed of various materials and using various techniques. In one exemplary embodiment, lower pre-metal dielectric 56 may be an HDP (high density plasma) undoped oxide and upper pre-metal dielectric 58 may be a PSG (phospho-silicate glass) dielectric.

As illustrated in FIGS. 6 and 7, the protruding spacers of the present invention yield an improved alignment margin by way of an added spacer thickness (a greater approach distance 54) at the edges of gate electrode layers 9. In addition to the thickness of nitride layer 47, which extends along sides 62 of oxide spacer 39, the protruding spacer provides increased lateral and diagonal dielectric thicknesses at top corner 10 of gate dielectric layer 9 compared to the lateral and diagonal dielectric thicknesses at point 64 at the top of oxide spacers 39. Without the advantage of the present invention, the lateral and diagonal dielectric thicknesses at top corner 10 of gate electrode layer 9 would be substantially as shown at point 64. Therefore an increased margin of error is achieved in aligning and forming SACs.

FIG. 7 shows an arbitrarily positioned, possible contact opening 60, shown by dashed lines, which may be formed to contact source/drain region 35 formed within substrate 3. Possible SAC contact opening 60 may be aligned and formed using various suitable photolithographic and etching techniques. After an actual contact opening is formed, such opening is subsequently filled with a conductive and/or semiconductor material. It can be seen that arbitrary possible SAC contact opening 60 includes a side (left-hand side) that is generally coincident with an oxide spacer 39. If possible SAC contact opening 60 were slightly misaligned and formed closer to left-hand side gate electrode 50 such that more of nitride layer 47 was exposed while forming possible SAC contact opening 60, it can be seen that a spacer dielectric structure, including nitride layer 47, provides a greater degree of protection to gate electrode layer 9than would a conventional spacer structure including the same general shape but extending only up to top corner 10 of gate electrode layer 9. A more robust SAC alignment and etching process is achieved as the structure formed using the protruding oxide spacers of the present invention is more resistant to an alignment and/or etching error resulting in a short between gate electrode layer 9 and source/drain region 35 once the opening, such as possible opening 60, is filled.

The preceding merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. For example, the sacrificial layer may be formed of materials other than amorphous carbon and the spacers may be formed of materials other than oxides.

Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. A semiconductor product comprising a gate structure formed over a semiconductor substrate, said gate structure having a pair of opposed sidewalls and a first height, and a pair of dielectric spacers, each spacer extending along a respective sidewall and having a spacer height;
   wherein the spacer height exceeds the first height by approximately a thickness of a sacrificial layer previously formed over the gate structure; and
   wherein the previously formed sacrificial layer comprised amorphous carbon.

2. The semiconductor product as in claim 1, wherein said gate structure includes an upper surface and each of said spacers protrudes above said upper surface, the previously formed sacrificial layer having been formed on the upper surface.

3. The semiconductor product as in claim 2, wherein each of said spacers protrudes above said upper surface by a distance ranging from approximately 500 angstroms to approximately 2000 angstroms.

4. The semiconductor product as in claim 2, in which said gate structure includes a gate electrode layer and a hardmask layer disposed thereover, said upper surface being a surface of said hardmask layer.

5. The semiconductor product as in claim 1, in which said spacers each include a generally planar inner surface that forms a conterminous portion with said respective sidewall, and each spacer includes a protruding portion that extends above said respective sidewall.

6. The semiconductor product as in claim 1, further comprising a nitride layer formed thereover.

7. A semiconductor product comprising:
  a gate structure formed over a semiconductor substrate, the gate structure having at least one sidewall and a first height; and,
  at least one dielectric spacer extending along the sidewall and having a spacer height;
  wherein the spacer height exceeds the first height by approximately a thickness of a sacrificial layer previously formed over the gate structure; and
  wherein the previously formed sacrificial layer was a layer comprising amorphous carbon.

8. The semiconductor product of claim 7, wherein the spacer height exceeds the first height by approximately 500 angstroms to approximately 2000 angstroms.

9. The semiconductor product of claim 7, wherein the gate structure includes an upper surface, the previously formed sacrificial layer having been formed on the upper surface.

10. The semiconductor product of claim 9, in which the gate structure includes a gate electrode layer and a hardmask layer disposed thereover, the upper surface being a surface of the hardmask layer.

11. The semiconductor product of claim 7, wherein the sidewall includes a generally planar inner surface that forms a conterminous portion with the sidewall, and the spacer includes a protruding portion that extends above the sidewall.

12. The semiconductor product of claim 7, further comprising a nitride layer formed thereover.

13. A semiconductor product comprising a gate structure formed over a semiconductor substrate, the gate structure having a pair of opposed sidewalls and a first height, and a pair of dielectric spacers, each spacer extending along a respective sidewall and having a spacer height;
  wherein the gate structure comprises a gate electrode layer and a hardmask layer disposed thereover; and
  wherein the spacer height exceeds the first height by approximately a thickness of a sacrificial layer previously formed over an upper surface of the hardmask layer.

14. The semiconductor product as in claim 13, wherein each of the spacers protrudes above said upper surface by a distance ranging from approximately 500 angstroms to approximately 2000 angstroms.

15. The semiconductor product as in claim 13, in which said spacers each include a generally planar inner surface that forms a conterminous portion with said respective sidewall, and each spacer includes a protruding portion that extends above said respective sidewall.

16. The semiconductor product as in claim 13, further comprising a nitride layer formed over the gate structure.

17. A semiconductor product comprising:
  a gate structure, comprising a gate electrode layer and a hardmask layer disposed thereover, formed over a semiconductor substrate, the gate structure having at least one sidewall and a first height; and,
  at least one dielectric spacer extending along the sidewall and having a spacer height;
  wherein the spacer height exceeds the first height by approximately a thickness of a sacrificial layer previously formed over an upper surface of the hardmask layer.

18. The semiconductor product of claim 17, wherein the spacer height exceeds the first height by approximately 500 angstroms to approximately 2000 angstroms.

19. The semiconductor product of claim 17, wherein the sidewall includes a generally planar inner surface that forms a conterminous portion with the sidewall, and the spacer includes a protruding portion that extends above the sidewall.

20. The semiconductor product of claim 17, further comprising a nitride layer formed over the gate structure.

* * * * *